United States Patent
Stratmann et al.

(10) Patent No.: US 11,378,381 B2
(45) Date of Patent: Jul. 5, 2022

(54) MAGNETIC FIELD SENSOR AND METHOD FOR MOUNTING A MAGNET

(71) Applicant: ZF Friedrichshafen AG, Friedrichshafen (DE)

(72) Inventors: Julian Stratmann, Melle (DE); Michael Klank, Osnabrück (DE); Stefan Krahn, Osnabrück (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 41 days.

(21) Appl. No.: 16/760,964

(22) PCT Filed: Oct. 2, 2018

(86) PCT No.: PCT/EP2018/076856
§ 371 (c)(1),
(2) Date: May 1, 2020

(87) PCT Pub. No.: WO2019/086191
PCT Pub. Date: May 9, 2019

(65) Prior Publication Data
US 2020/0300603 A1   Sep. 24, 2020

(30) Foreign Application Priority Data
Nov. 3, 2017 (DE) ...................... 10 2017 219 584.3

(51) Int. Cl.
*G01B 7/30* (2006.01)
*G01D 5/14* (2006.01)
(Continued)

(52) U.S. Cl.
CPC ............. *G01B 7/30* (2013.01); *G01D 5/145* (2013.01); *G01D 5/24442* (2013.01); *G01R 33/0017* (2013.01); *G01R 33/072* (2013.01)

(58) Field of Classification Search
CPC ........... G01D 5/145; G01B 7/30; G01R 33/07
See application file for complete search history.

(56) References Cited

U.S. PATENT DOCUMENTS 7,841,799 B2 * 11/2010 Spratte ................ F16C 11/0647
403/122
2004/0100357 A1  5/2004 Kruse
(Continued)

FOREIGN PATENT DOCUMENTS

DE    10 2016 010 332 A1   3/2018
DE    10 2017 208 410 B3   8/2018
(Continued)

OTHER PUBLICATIONS

German Office Action Corresponding to 10 2017 219 584.3 dated Jul. 6, 2018.
(Continued)

*Primary Examiner* — Reena Aurora
(74) *Attorney, Agent, or Firm* — Finch & Maloney PLLC; Michael J. Bujold; Jay S. Franklin

(57) ABSTRACT

A magnetic field sensor has a magnet (M1) that produces a magnetic field with a magnetic field axis (f), has a magnet axis (a) and is held in a component (4) that can move about at least one axis and has a component axis (b). Also a method for mounting a magnet (M1) of a magnetic field sensor. The magnet (M1) is held in the component (4) in such a manner that the magnetic field axis (f) coincides, as closely as possible, with the component axis (b). A deviation of the magnetic field axis (f) from the magnet axis (a) is measured, and the angle of deviation ($\alpha$) is corrected during the mounting of the magnet (M1) in the component (4).

14 Claims, 4 Drawing Sheets

(51) Int. Cl.
  *G01D 5/244* (2006.01)
  *G01R 33/00* (2006.01)
  *G01R 33/07* (2006.01)

(56) References Cited

U.S. PATENT DOCUMENTS

| | | |
|---|---|---|
| 2008/0231262 A1 | 9/2008 | Wolf et al. |
| 2009/0016811 A1 | 1/2009 | Spratte |
| 2012/0025810 A1 | 2/2012 | Uhlenbruck |
| 2013/0015844 A1 | 1/2013 | Bogos et al. |
| 2015/0168124 A1 | 6/2015 | Bondar |
| 2018/0231051 A1* | 8/2018 | Klank ................ F16C 11/0604 |

FOREIGN PATENT DOCUMENTS

| | | | |
|---|---|---|---|
| EP | 0 617 260 A1 | 9/1994 | |
| FR | 2 776 064 A1 | 9/1999 | |

OTHER PUBLICATIONS

International Search Report Corresponding to PCT/EP2018/076856 dated Nov. 21, 2018.
Written Opinion Corresponding to PCT/EP2018/076856 dated Nov. 21, 2018.

* cited by examiner

MAGNETIC FIELD SENSOR AND METHOD FOR MOUNTING A MAGNET

This application is a National Stage completion of PCT/EP2018/076856 filed Oct. 2, 2018, which claims priority from German patent application serial no. 10 2017 219 584.3 filed Nov. 3, 2017.

FIELD OF THE INVENTION

The invention relates to a magnetic field sensor, a method and a device for carrying out the method.

BACKGROUND OF THE INVENTION

Magnetic field sensors are known, among other things, as position sensors, in particular also for measuring an angular position. Magnetic field sensors consist of two sensor elements, namely a first sensor element which is in the form of a permanent magnet and acts as a signal emitter, and a second sensor element which is in the form of a sensor element sensitive to magnetic fields and acts as a signal receiver. The second sensor element can for example be a Hall element.

From the older application by the present applicant with file number 10 2017 208 410.3 a magnetic field sensor has become known, which sensor consists of a permanent magnet as the signal emitter and a sensor element as the signal receiver, this device being built into a ball joint. In this case the permanent magnet is located in a recess, specifically a blind-hole bore in the ball stud, whereas the second sensor element, the signal receiver, is arranged in a housing that holds the ball stud. When the ball stud undergoes angular movements relative to the housing, the second sensor element registers a change of the magnetic field. By evaluating this change of signal, the angular position can be concluded.

A problem with magnetic field sensors of this type is that the magnetic field produced by the magnet is prone to tolerance effects and deviations from the nominal condition; in particular erroneous positioning of the axis of the magnetic field, can occur. Such an erroneous positioning occurs when the axis of the magnetic field and the axis of the magnet, which is arranged in a movable component, do not coincide but form an angle with one another. The indication of an angular position with a magnetic field with such an error is then also affected by an error or deviation.

SUMMARY OF THE INVENTION

A purpose of the present invention is to improve the measurement accuracy of a magnetic field sensor of the type mentioned at the start.

The invention has the characteristics specified in the independent claims. Advantageous design features emerge from the subordinate claims.

According to a first aspect of the invention, in a magnetic field sensor with a magnet, a magnet axis, a magnetic field and a magnetic field axis, it is provided that the magnet is accommodated in the movable component in such a way that the magnetic field axis largely corresponds to the axis of the component. The magnet axis is understood to mean the geometric axis of the body of the magnet. The magnet produces a magnetic field which has a magnetic field axis that forms the symmetry axis of the field lines of the magnetic field. The component axis should be understood to mean the axis of the movable component that represents a reference axis for the zero position of the component relative to angular movements toward one side or the other. Commercially available magnets as a rule show a deviation of the magnetic field axis relative to the geometrical axis of the magnet, i.e. the magnet axis, which deviation can be in a range of plus or minus 5°. For an exact measurement, as free from error as possible, of a deviation of the component from its zero position, it is necessary for the magnetic field axis to coincide with the reference axis, i.e. with the axis of the component in its zero position. This ensures that the magnetic field or magnetic field axis moves by the same angular amount as does the component, toward either side or in the opposite direction.

In a preferred embodiment, the magnet is in the form of a cylindrical body and the axis of the magnet is a cylinder axis. Magnetic bodies of cylindrical shape can be produced simply, i.e. shaped and magnetized, such that a radially symmetrical magnetic field with radially symmetrically arranged field lines is obtained.

According to a further preferred embodiment, the magnet axis is tilted relative to the component axis, to an extent such that the magnetic field axis coincides with the component axis. Preferably, the magnet axis is tilted by the amount of the angle of deviation. The angle of deviation is given by the erroneous position between the magnetic field axis and the magnet axis when the magnet is fitted into the component.

According to a further preferred embodiment, the magnet axis is arranged axis-parallel to but offset from the axis of the component, by an amount or with an offset that brings the magnetic field axis into coincidence with the component axis. Preferably, the axial offset is adapted to the deviation angle between the magnet axis and the magnetic field axis. By virtue of the axial offset the magnet moves closer to the wall of the recess in the component, which results in a tilting or displacement of the magnetic field axis. Due to the eccentric arrangement of the magnet in the receiving opening of the component, the magnetic field is influenced in an asymmetrical way, so that the deviation angle is compensated.

In a further preferred embodiment the magnet is preferably a cylindrical magnet arranged coaxially, i.e. centrally in the receiving opening of the component. To compensate for a deviation of the magnetic field or an erroneous position of the magnetic field axis, compensation bodies are arranged in the circumferential area. The compensation bodies, which consist of a magnetically conductive material and are only arranged in some areas on the circumference, have the effect that the magnetic field is changed in such manner that the magnetic field axis changes its position and is moved toward the component axis.

According to a further preferred embodiment, the magnet is surrounded by an annular plastic housing in which the compensation bodies can be implanted at various points. Thus, the plastic housing constitutes a repository which is fitted with the bodies only at parts of the circumference, preferably diametrically opposite the position of the deviation of the magnetic field axis.

In a further preferred embodiment, the compensation bodies are in the form of pins or wire inserts, which permits a fine selection of the quantity required for influencing the magnetic field.

According to a further preferred embodiment, the component is in the form of a ball stud of a ball joint or a ball sleeve of a ball sleeve joint. In both cases the magnetic field sensor serves for angle measurement. In a ball stud the component axis corresponds to the longitudinal axis of the ball stud. In a ball sleeve the component axis would extend perpendicularly to the longitudinal axis of the ball sleeve.

In a further preferred embodiment the ball joint or ball sleeve joint, respectively, has a joint housing in which a sensor element sensitive to magnetic fields is positioned within the active range of the magnetic field. Accordingly, an angular movement of the ball or ball sleeve results in a signal in the sensor element and hence to an angle indication.

According to another aspect of the invention, in a method for mounting a magnet of a magnetic field sensor the following process steps are involved: First a commercially available magnet for fitting into the component is provided, wherein as a rule the magnetic field axis of the magnet deviates from the axis of the magnet itself. In the next step the magnet is checked for such a deviation, namely for the position and size of the deviation, as necessary, i.e. on the one hand the circumferential angle and on the other hand the angle of deviation between the axis of the magnet and the magnetic field axis. In the next process step the magnet is placed in a mounting device and positioned in the component, i.e. in a receiving opening provided in the component, and at the same time a correction of the angle of deviation is carried out in such manner that the magnetic field axis and the component axis coincide. Thus, the detection of the erroneous position of the magnet and the subsequent correction of that error during the fitting of the magnet into the component take place in a work sequence without intermediate steps.

According to a further aspect of the invention, the device for carrying out the mounting process comprises a pivoting arm which comprises a first limb arranged with articulation and a second limb angled relative to the first limb, with a gripping head to hold the magnet. By virtue of the articulated arrangement the angle of deviation can be corrected as the magnet is being mounted, and by means of the gripping head the magnet is taken up and positioned in the component in such manner that the angle of deviation has been corrected and the magnetic field axis coincides with the component axis.

Example embodiments of the invention are shown in the drawings and will be described in greater detail below, so that from the description and/or the drawings further features and/or advantages can emerge. The drawings show:

DETAILED DESCRIPTION OF THE PREFERRED EMBODIMENTS

Figure 1A:
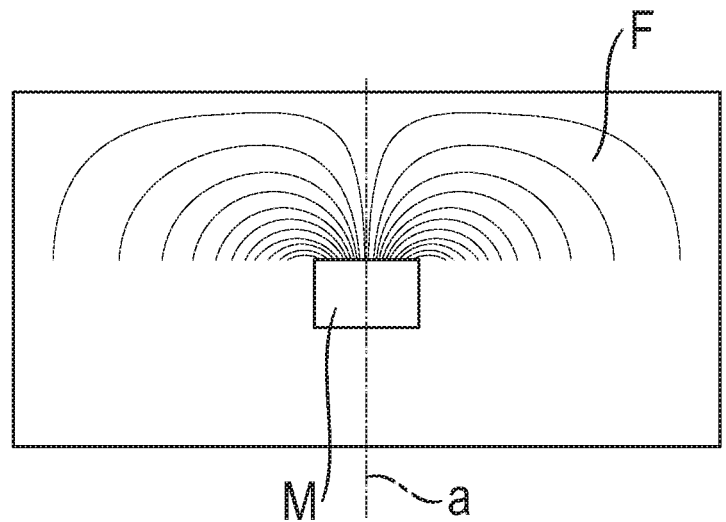
FIG. 1a: A magnet with a magnetic field, in a fault-free condition.

FIG. 1a shows a magnet M with a magnet axis a, the magnet M preferably being cylindrical and the magnet axis a corresponding to the axis of the cylinder. Basically, the axis a of the magnet is the geometrical axis of the magnet M. The magnet M produces a magnetic field F, whose field line shape is arranged symmetrically to the axis a, i.e. the magnetic field axis coincides with the magnet axis a. Thus, the representation of the magnetic field F and the magnet M corresponds to a fault-free condition, as required for a magnetic field sensor.

Figure 1B:
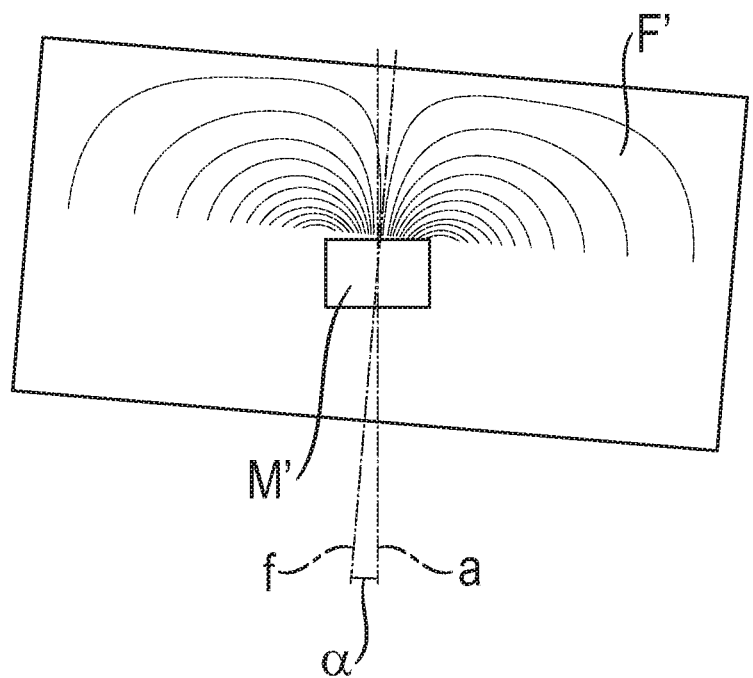
FIG. 1b: A magnet with a magnetic field, with the magnetic field axis in an erroneous position.

FIG. 1b shows a commercially available magnet M' with a magnet axis a which—as mentioned before—corresponds to the geometrical axis of the magnet M. The magnet M' produces a magnetic field F' which has a magnetic field axis f that is inclined relative to the magnet axis a by a deviation angle $\alpha$. Thus, the magnetic field F' is not arranged symmetrically to the magnet axis a, so that the magnet axis a and the magnetic field axis f do not coincide. The deviation angle $\alpha$ will also be called the field angle error $\alpha$ in what follows. In the commercially available magnet M' field angle errors attributable to manufacturing factors occur within a range of plus or minus 5°. If such magnets with a field angle error are built into magnetic field sensors used for angle measurement, the result of the measurement will incorporate an angle error. The present invention aims to avoid such measurement errors.

Figure 2A:
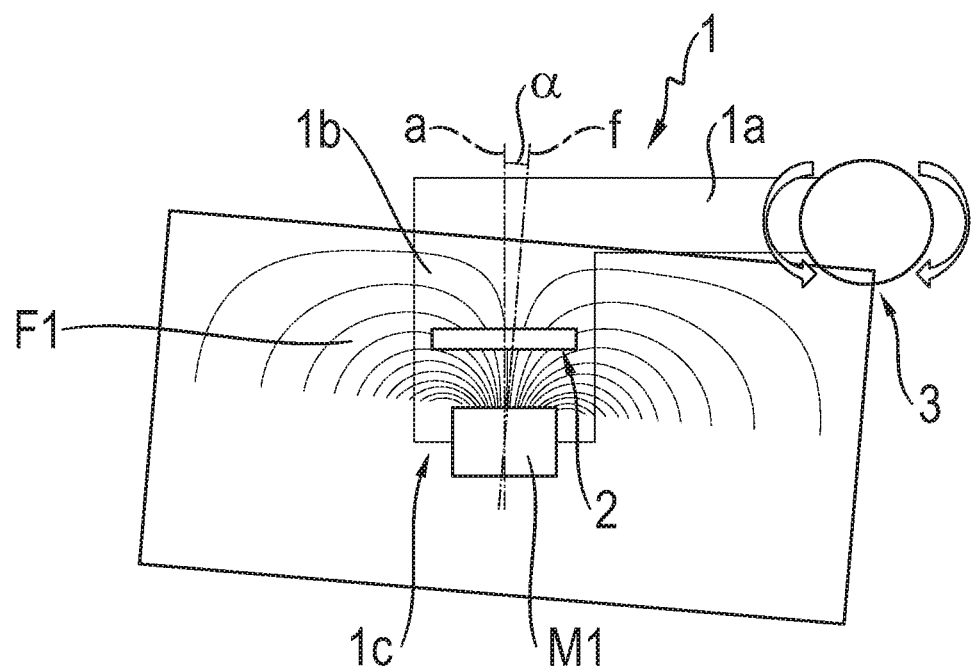
FIG. 2a: A device for measuring an angular deviation between the magnet axis and the magnetic field axis (field angle error) of a magnet.

FIG. 2a shows a device 1 for receiving, measuring and mounting a magnet M1, which produces a magnetic field F1 that is affected by a field angle error $\alpha$. The geometrical axis of the cylindrical magnet M1, i.e. the magnet axis a, forms with the axis of the magnetic field F1, i.e. the magnetic field axis f, the deviation angle $\alpha$, which is also called the field angle error $\alpha$. The device 1 comprises a sensor element 2 which detects the field angle error $\alpha$. The device 1 is arranged to pivot by virtue of a joint 3 and has a first limb 1a that extends approximately horizontally in the drawing and a second limb 1b that extends approximately vertically in the drawing, in which the sensor element 2 is arranged. The second limb 1b has at its end a gripping head 1c, in which the magnet M1 is held.

Figure 2B:
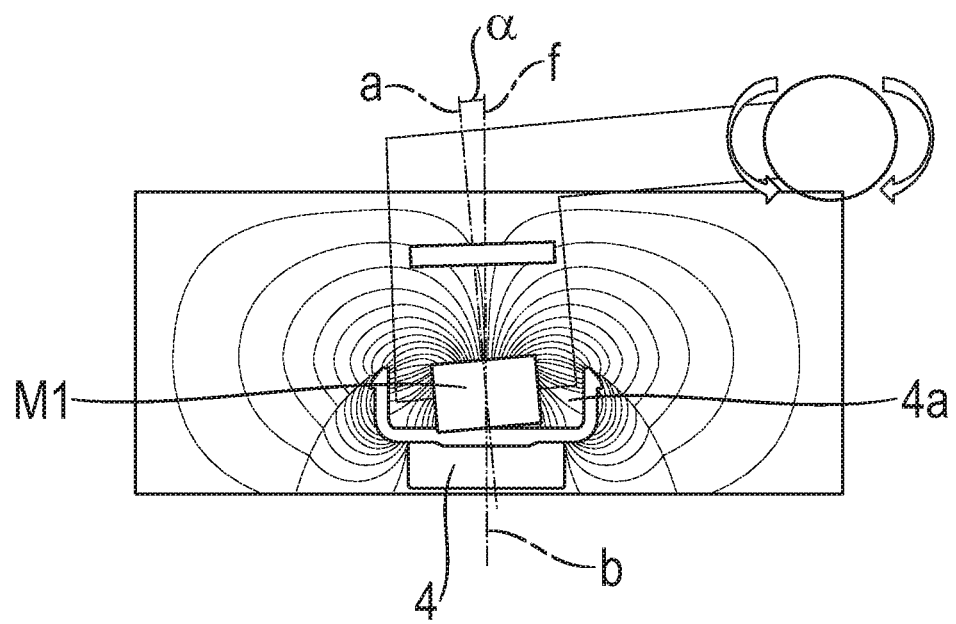
FIG. 2b: Mounting of the magnet, corrected for the field angle error, in a tilted position in the component.

FIG. 2b shows the pivoting device 1 during the fitting of the magnet M1 into a component 4, which has a receiving opening 4a for the magnet M1. The component 4 can preferably be a ball stud 4 of a ball joint, as known from DE 10 2004 039 781 A1 by the present applicant. The component 4 or ball stud 4 has a component axis b or ball stud axis b. As can be seen from the figure, compared with FIG. 2a the device 1 is pivoted so that the magnet axis a is tilted relative to the component axis b, and this by the amount of the field angle error $\alpha$. The result of this is that the magnetic field axis f coincides with the component axis b. Thus, in the drawing the magnetic field axis f and the component axis b are arranged vertically. The tilted position of the magnet M1 can be set by adhesively bonding the magnet M1 to the component 4. Besides the tilting, the radial offset can also be adjusted by means of the device 1, in particular by the gripping head 1c of the second limb 1b.

Figure 3A:
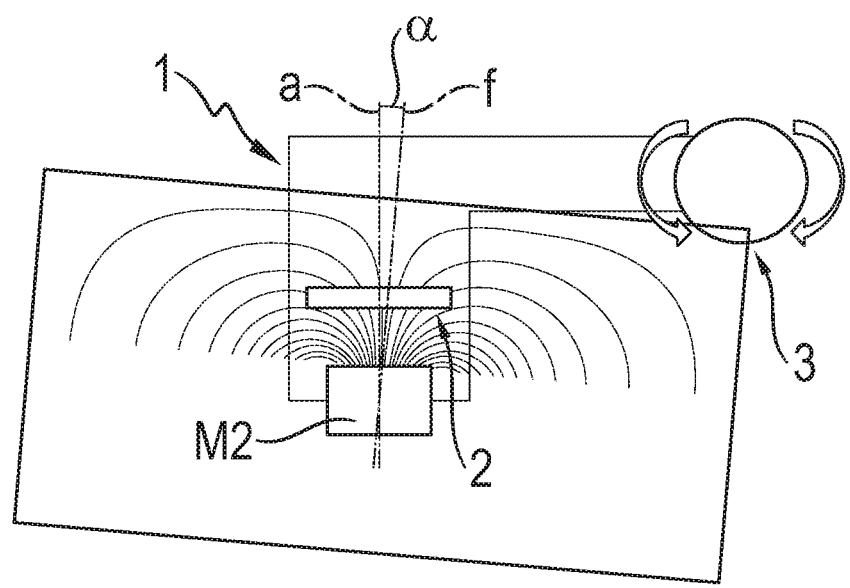
FIG. 3a: Device as in FIG. 2 for measuring the field angle error.

FIG. 3a shows a further embodiment of the invention for compensating for a field angle error when mounting a magnet M2. FIG. 3a corresponds to FIG. 2a and shows the device 1 arranged so as to pivot by virtue of the joint 3, for measuring the field angle error $\alpha$. The magnet's axis is denoted by a and the magnetic field axis by f. The field angle error $\alpha$, i.e. the inclination of the magnetic field, is detected by the sensor element 2.

Figure 3B:
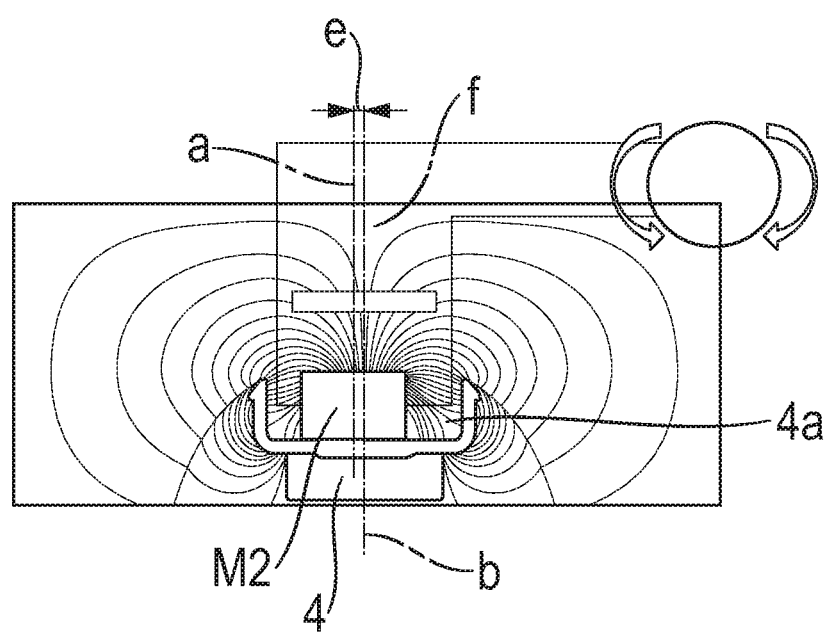
FIG. 3b: Mounting of the magnet, corrected for the field angle error, in an axis-parallel, off-center position in the component.

FIG. 3b shows the mounting of the magnet M2 by means of the device 1 in an opening 4a of the component 4 or the ball stud 4, which has the stud or component axis b. From the figure it can be seen that the magnet axis a is offset relative to the component axis b, and this by an offset e. Thus, the magnet M2 is arranged off-center in the receiving opening, which is in the form of a blind-hole bore 4a with the axis b. The advantage of this embodiment compared with the embodiment shown in FIG. 2b is that the magnet M2 rests flat on the bottom of the receiving opening 4a.

Figure 4A:
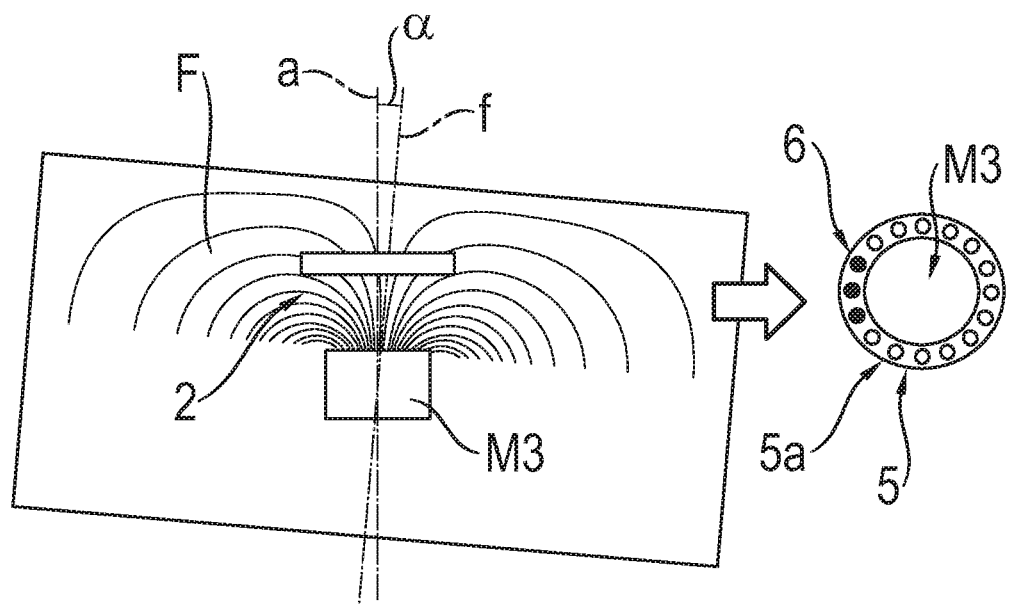
FIG. 4a: Measurement of the field angle error of a magnet.

FIG. 4a shows a magnet M3 with a magnetic field F, whose magnetic field axis f is inclined relative to the magnet axis a and therefore has a field angle error α, which is detected by the sensor element 2. On the right-hand side of FIG. 4a the magnet M3, seen as viewed from above, is arranged in an annular plastic housing 5 which has a plurality of cylindrical chambers 5a arranged around the circumference. In some of the chambers 5a (in the drawing three of them) compensation bodies 6 in the form of pins or wire inserts 6 are implanted. The compensation bodies 6 are made of a magnetically conductive material, preferably steel. The steel pins 6 have the effect that the magnetic field F according to FIG. 4a is displaced and the field angle error α is thereby corrected.

Figure 4B:
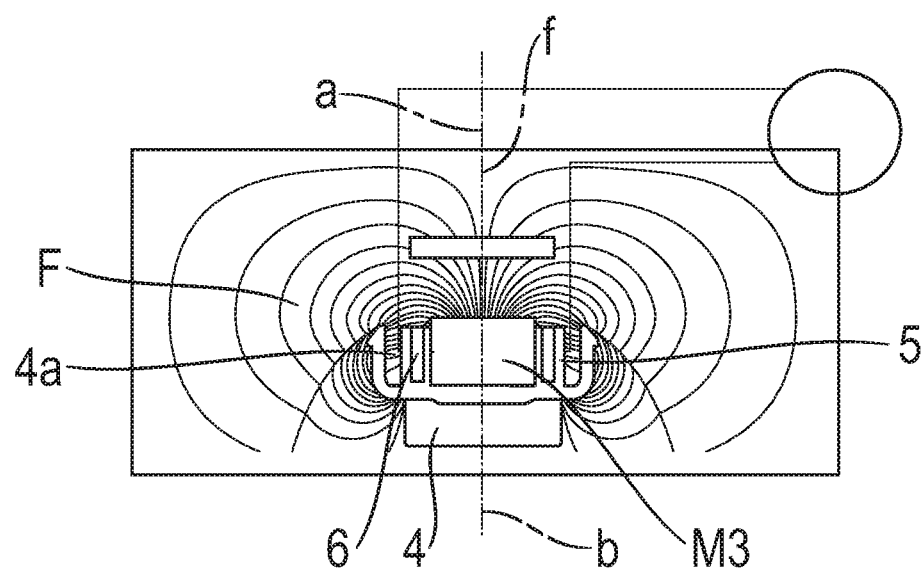
FIG. 4b: Mounting of the magnet with correction of the field angle error by steel inserts in a plastic housing.

FIG. 4b shows the magnet M3 with its plastic housing 5 including the compensation bodies 6, fitted into the receiving opening 4a of the component 4 with the component axis b. From the figure it can be seen that the magnetic field F is arranged symmetrically with respect to the component axis b, and the magnetic field axis f and the magnet axis a coincide. The advantage of this embodiment is that the magnet M3 is fitted centrally and flat, or can if necessary be corrected by radial displacement.

The component 4 can also be in the form of a ball sleeve of a ball sleeve joint, as for example has become known from DE 103 58 763 A1 by the present applicant.

INDEXES

1 Device
1a First limb
1b Second limb
1c Gripping head
2 Sensor element
3 Joint
4 Component/ball stud
4a Receiving opening/bore
5 Plastic housing
5a Chamber
6 Compensation body/steel pin
a Axis of the magnet
b Axis of the component
e Axis offset
f Magnetic field axis
F Magnetic field
F' Magnetic field with positional error
M Magnet
M' Magnet (commercially available)
M1 Magnet
M2 Magnet
M3 Magnet
α Angle of deviation/field angle error

The invention claimed is:

1. A magnetic field sensor with a magnet that produces a magnetic field having a magnetic field axis,
the magnet having a magnet axis, and the magnet being positioned in a receiving opening of a component that is movable about at least one axis,
the component having a component axis, and
during installation of the magnet, a position of the magnet, relative to the receiving opening of the component, being adjusted by a mounting device so that the magnetic field axis coincides with the component axis, and, thereafter, the adjusted position of the magnet, relative to the receiving opening of the component, being secured by an adhesive so as to retain the magnetic field axis coincident with the component axis.

2. The magnetic field sensor according to claim 1, wherein the magnet is in a form of a cylindrical body and the magnet axis is a cylinder axis.

3. The magnetic field sensor according to claim 1, wherein the magnet axis of the magnet is tilted relative to the component axis.

4. The magnetic field sensor according to claim 3, wherein the magnetic field axis and the magnet axis form a deviation angle and the magnet axis is tilted relative to the component axis by the deviation angle.

5. The magnetic field sensor according to claim 1, wherein the magnet axis of the magnet is arranged parallel to the component axis with an offset.

6. The magnetic field sensor according to claim 5, wherein the magnetic field axis and the magnet axis form a deviation angle and the offset is adapted to the deviation angle.

7. The magnetic field sensor according to claim 1, wherein the component is in a form of either a ball stud of a ball joint or a ball sleeve of a ball sleeve joint.

8. The magnetic field sensor according to claim 7, wherein the ball joint or the ball sleeve joint has a joint housing, and a sensor element sensitive to magnetic fields is arranged in the joint housing in an area of the magnetic field of the magnet.

9. A magnetic field sensor with a magnet that produces a magnetic field having a magnetic field axis,
the magnet having a magnet axis and being held in a component that is movable about at least one axis,
the component having a component axis, and
the magnet being held in the component in such a manner that the magnetic field axis substantially coincides with the component axis,
wherein the magnet axis of the magnet coincides with the component axis and compensation bodies, consisting of a magnetically conductive material, are arranged in a circumferential area of the magnet.

10. The magnetic field sensor according to claim 9, wherein the magnet is arranged in an annular plastic housing in which the compensation bodies are implanted.

11. The magnetic field sensor according to claim 10, wherein an axis of the plastic housing is arranged parallel to the magnet axis and the housing has chambers for holding the compensation bodies distributed around a circumference of the housing.

12. The magnetic field sensor according to claim 9, wherein the compensation bodies in a form of either pins or wire inserts.

13. A method for mounting a magnet of a magnetic field sensor according that produces a magnetic field having a magnetic field axis, the magnet having a magnet axis and being held in a component that is movable about at least one axis, the component having a component axis, and the magnet being held in the component in such a manner that the magnetic field axis substantially coincides with the component axis, the method comprising:
procuring a commercially available magnet,
checking the magnet for manufacture-related deviations,
measuring any deviation of the magnetic field axis from the magnet axis,
determining an angle of deviation with a sensor,
holding the magnet with a mounting device, positioning the magnet in the component, and, at a same time, correcting the angle of deviation of the magnet with the mounting device so that the magnetic field axis coincides with the component axis, and adhesively securing the magnet, relative to the component, in the adjusted position such that the magnetic field axis coincides with the component axis following adhesively securing the magnet to the component.

14. A device for carrying out the method according to claim 13, the device comprising a pivoting arm with a first articulated limb and with a second limb angled relative to the first limb, which has at an end a gripping head for holding the magnet.

\* \* \* \* \*